(12) United States Patent
Shoham et al.

(10) Patent No.: US 10,318,588 B2
(45) Date of Patent: Jun. 11, 2019

(54) SEARCHING VARYING SELECTABLE PHYSICAL BLOCKS OF ENTRIES WITHIN A CONTENT-ADDRESSABLE MEMORY

(71) Applicant: Cisco Technology, Inc., San Jose, CA (US)

(72) Inventors: Doron Shoham, Shoham (IL); Sivan Avraham, Hadera (IL); Aravinth Nagamani Manickam, Cupertino, CA (US)

(73) Assignee: Cisco Technology, Inc., San Jose, CA (US)

( * ) Notice: Subject to any disclaimer, the term of this patent is extended or adjusted under 35 U.S.C. 154(b) by 156 days.

(21) Appl. No.: 15/640,517

(22) Filed: Jul. 1, 2017

(65) Prior Publication Data

US 2019/0005152 A1    Jan. 3, 2019

(51) Int. Cl.
| | | |
|---|---|---|
| *G06F 13/00* | (2006.01) | |
| *G06F 16/903* | (2019.01) | |
| *H04L 12/743* | (2013.01) | |
| *G06F 12/1027* | (2016.01) | |
| *H04L 29/06* | (2006.01) | |
| *H04L 12/879* | (2013.01) | |
| *G06F 16/9038* | (2019.01) | |

(52) U.S. Cl.
CPC .... *G06F 16/90339* (2019.01); *G06F 12/1027* (2013.01); *G06F 16/9038* (2019.01); *H04L 45/7453* (2013.01); *H04L 49/901* (2013.01); *H04L 69/22* (2013.01)

(58) Field of Classification Search
CPC ...... G06F 9/5016; G06F 9/5061; G11C 15/00
See application file for complete search history.

(56) References Cited

U.S. PATENT DOCUMENTS

| | | |
|---|---|---|
| 6,374,326 B1 | 4/2002 | Kansal et al. |
| 6,389,506 B1 | 5/2002 | Ross et al. |

(Continued)

OTHER PUBLICATIONS

Bremler-Barr et al., PEDS: A Parallel Error Detection Scheme for TCAM Devices, IEEE/ACM Transaction on Networking, vol. 18, No. 5, October 2010, IEEE, New York, New York (eleven pages).

*Primary Examiner* — Sean D Rossiter
(74) *Attorney, Agent, or Firm* — The Law Office of Kirk D. Williams (57) ABSTRACT

In one embodiment, a content-addressable memory has multiple blocks of content-addressable memory entries, including different first and second sets of content-addressable memory blocks. One embodiment determines the first set of content-addressable memory blocks based on a content-addressable memory profile identifier and a search key and then performs a first content-addressable memory lookup operation in each of the first set of content-addressable memory blocks, but not in the second set of content-addressable memory blocks, based on the search key. If at least one entry is match, a corresponding result is identified. Otherwise, in one embodiment, the second set of content-addressable memory blocks is determined based on the content-addressable memory profile identifier but not based on the search key, and a search is made therein to identify a matching result or that no match was determined. In one embodiment, a matching result determines how a packet is processed.

17 Claims, 5 Drawing Sheets

(56) References Cited

U.S. PATENT DOCUMENTS

| | | |
|---|---|---|
| 6,526,474 B1 | 2/2003 | Ross |
| 6,535,951 B1 | 3/2003 | Ross |
| 6,606,681 B1 | 8/2003 | Uzun |
| 6,715,029 B1 | 3/2004 | Trainin et al. |
| 6,738,862 B1 | 5/2004 | Ross et al. |
| 6,871,262 B1 | 3/2005 | Oren et al. |
| 7,103,708 B2 | 9/2006 | Eatherton et al. |
| 7,257,672 B2 | 8/2007 | Shoham et al. |
| 7,260,673 B1 | 8/2007 | Ross |
| 7,290,083 B2 | 10/2007 | Shoham et al. |
| 7,305,519 B1 | 12/2007 | Nagaraj |
| 7,345,897 B2 | 3/2008 | Krishnan et al. |
| 7,349,230 B2 | 3/2008 | Parthasarathy et al. |
| 7,350,131 B2 | 3/2008 | Trainin |
| 8,467,213 B1 * | 6/2013 | Channabasappa ....... G11C 5/14 365/49.1 |
| 8,887,026 B2 | 11/2014 | Bremler-Barr et al. |
| 9,596,324 B2 * | 3/2017 | Hass .................... G06F 9/30054 |
| 2002/0075714 A1 * | 6/2002 | Pereira ................... G11C 15/00 365/49.1 |
| 2006/0212426 A1 * | 9/2006 | Shakara ................. H04L 45/00 |
| 2007/0115986 A1 * | 5/2007 | Shankara ............. H04L 63/145 370/392 |
| 2008/0192754 A1 * | 8/2008 | Ku .......................... H04L 45/00 370/395.32 |
| 2009/0041017 A1 * | 2/2009 | Luk ......................... H04L 45/00 370/392 |
| 2011/0060876 A1 * | 3/2011 | Liu ..................... G06F 12/1018 711/108 |
| 2014/0003436 A1 * | 1/2014 | Wang ................. H04L 45/7457 370/392 |
| 2014/0006706 A1 * | 1/2014 | Wang ................ G06F 16/90339 711/108 |

\* cited by examiner

SEARCHING VARYING SELECTABLE PHYSICAL BLOCKS OF ENTRIES WITHIN A CONTENT-ADDRESSABLE MEMORY

TECHNICAL FIELD

The present disclosure relates generally forwarding packets in a network based on lookup results (e.g., longest prefix matching) in a content-addressable memory (e.g., a binary or ternary content-addressable memory) that includes multiple blocks of content-addressable memory entries.

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Content-addressable memories (e.g., binary and ternary content-addressable memories) are particularly useful in performing lookup operations in determining how to forward a packet in a network by a packet switching device.

BRIEF DESCRIPTION OF THE DRAWINGS

The appended claims set forth the features of one or more embodiments with particularity. The embodiment(s), together with its advantages, may be understood from the following detailed description taken in conjunction with the accompanying drawings of which:

DESCRIPTION OF EXAMPLE EMBODIMENTS

1. Overview

Disclosed are, inter alia, methods, apparatus, computer-storage media, mechanisms, and means associated with searching varying selectable physical blocks of entries within a content-addressable memory, such as, but not limited to, in performing a longest prefix match operation in determining how to forward a packet in a network.

One embodiment includes a content-addressable memory having multiple blocks, including a first one or more content-addressable memory blocks and a second one or more content-addressable memory blocks. The first one or more content-addressable memory blocks is less than all of searchable content-addressable memory blocks within the content-addressable memory and does not include a second one or more content-addressable memory blocks within the content-addressable memory. Each of the first and second one or more content-addressable memory blocks includes multiple content-addressable memory entries.

One embodiment includes a method performed in the content-addressable memory, with the method comprising: determining the first one or more content-addressable memory blocks based on a content-addressable memory profile identifier and a search key; and performing a first content-addressable memory lookup operation in each of the first one or more content-addressable memory blocks, but not in the second one or more content-addressable memory blocks, based on the search key and resulting in the identification of one or more first content-addressable memory matching entries.

One embodiment includes a method, comprising: determining the first one or more content-addressable memory blocks based on a content-addressable memory profile identifier and a search key; and performing a first content-addressable memory lookup operation in each of the first one or more content-addressable memory blocks, but not in the second one or more content-addressable memory blocks, based on the search key resulting in the identification of no content-addressable memory matching entries. Successively or in parallel, one embodiment determines the second one or more content-addressable memory blocks based on the content-addressable memory profile identifier but not based on the search key; and performing a second associative lookup operation in the second one or more content-addressable memory blocks resulting in the identification of one or more second content-addressable memory matching entries.

2. Description

Disclosed are, inter alia, methods, apparatus, computer-storage media, mechanisms, and means associated with searching varying selectable physical blocks of entries within a content-addressable memory, such as, but not limited to, in performing a longest prefix match operation in determining how to forward a packet in a network. As used herein a content-addressable memory block refers to one or more content-addressable banks of entries.

Embodiments described herein include various elements and limitations, with no one element or limitation contemplated as being a critical element or limitation. Each of the claims individually recites an aspect of the embodiment in its entirety. Moreover, some embodiments described may include, but are not limited to, inter alia, systems, networks, integrated circuit chips, embedded processors, ASICs, methods, and computer-readable media containing instructions. One or multiple systems, devices, components, etc., may comprise one or more embodiments, which may include some elements or limitations of a claim being performed by the same or different systems, devices, components, etc. A processing element may be a general processor, task-specific processor, a core of one or more processors, or other co-located, resource-sharing implementation for performing the corresponding processing. The embodiments described hereinafter embody various aspects and configurations, with the figures illustrating exemplary and non-limiting configurations. Computer-readable media and means for performing methods and processing block operations (e.g., a processor and memory or other apparatus configured to perform such operations) are disclosed and are in keeping with the extensible scope of the embodiments. The term "apparatus" is used consistently herein with its common definition of an appliance or device.

The steps, connections, and processing of signals and information illustrated in the figures, including, but not limited to, any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process said read value—the value must be obtained prior to processing it, although some of the associated processing may be performed prior to, concurrently with, and/or after the read operation). Also, nothing described or referenced in this document is admitted as prior art to this application unless explicitly so stated.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the terms "first," "second," etc., are typically used herein to denote different units (e.g., a first element, a second element). The use of these terms herein does not necessarily connote an ordering such as one unit or event occurring or coming before another, but rather provides a mechanism to distinguish between particular units. Moreover, the phrases "based on x" and "in response to x" are used to indicate a minimum set of items "x" from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. Moreover, the term "or" is used herein to identify a selection of one or more, including all, of the conjunctive items. Additionally, the transitional term "comprising," which is synonymous with "including," "containing," or "characterized by," is inclusive or open-ended and does not exclude additional, unrecited elements or method steps. Finally, the term "particular machine," when recited in a method claim for performing steps, refers to a particular machine within the 35 USC § 101 machine statutory class.

Figure 1A:
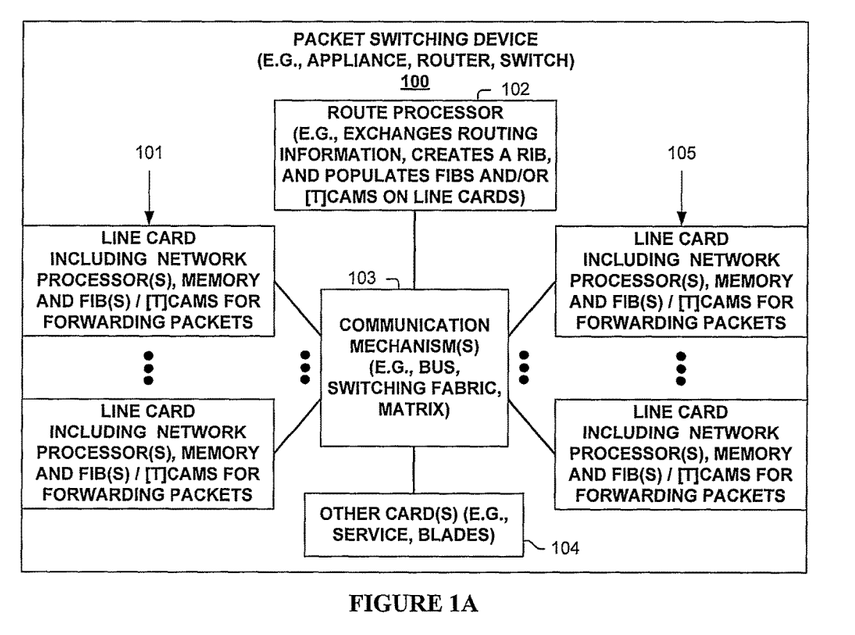
FIG. 1A illustrates a packet switching device including a content-addressable memory according to one embodiment.
Figure 1B:
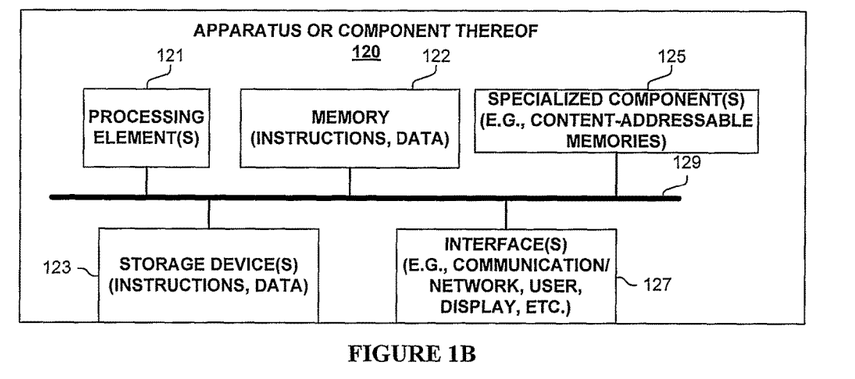
FIG. 1B illustrates an apparatus including a content-addressable memory according to one embodiment.

FIGS. 1A-B and their discussion herein are intended to provide a description of various exemplary packet switching systems used according to one embodiment that searches varying selectable physical blocks of entries within a content-addressable memory, such as, but not limited to, in performing a longest prefix match operation in determining how to forward a packet in a network. One embodiment of a packet switching device 100 is illustrated in FIG. 1A. As shown, packet switching device 100 includes multiple line cards 101 and 105, each with one or more network interfaces for sending and receiving packets over communications links (e.g., possibly part of a link aggregation group), and with one or more processing elements that are used in one embodiment associated with searching varying selectable physical blocks of entries within a content-addressable memory, such as, but not limited to, in performing a longest prefix match operation in determining how to forward a packet in a network. Packet switching device 100 also has a control plane with one or more processing elements 102 for managing the control plane and/or control plane processing of packets associated with searching varying selectable physical blocks of entries within a content-addressable memory, such as, but not limited to, in performing a longest prefix match operation in determining how to forward a packet in a network. Packet switching device 100 also includes other cards 104 (e.g., service cards, blades) which include processing elements that are used in one embodiment to process (e.g., forward, drop, manipulate) packets associated with searching varying selectable physical blocks of entries within a content-addressable memory, such as, but not limited to, in performing a longest prefix match operation in determining how to forward a packet in a network, and some communication mechanism 103 (e.g., bus, switching fabric, and/or matrix, etc.) for allowing its different entities 101, 102, 104 and 105 to communicate.

Line cards 101 and 105 typically perform the actions of being both an ingress and egress line card, in regards to multiple other particular packets and/or packet streams being received by, or sent from, packet switching device 100. In one embodiment, network processors on line cards 101 and/or 105 use a content-addressable memory with varying selectable physical blocks of entries to determine packet forwarding information (e.g., based on a lookup operation of a destination address, label or some other value) in a forwarding information base (FIB), and forward (or process in a different manner) the packet accordingly.

FIG. 1B is a block diagram of an apparatus 120 used in one embodiment associated with searching varying selectable physical blocks of entries within a content-addressable memory, such as, but not limited to, in performing a longest prefix match operation in determining how to forward a packet in a network. In one embodiment, apparatus 120 performs one or more processes, or portions thereof, corresponding to one of the flow diagrams illustrated or otherwise described herein, and/or illustrated in another diagram or otherwise described herein.

In one embodiment, apparatus 120 includes one or more processor(s) 121 (typically with on-chip memory), memory 122, storage device(s) 123, specialized component(s) 125 (e.g. optimized hardware such as for performing lookup and/or packet processing operations, performing multiple lookup and/or other operations in parallel, such as, but not limited to using content-addressable memory with varying selectable physical blocks of entries, etc.), and interface(s) 127 for communicating information (e.g., sending and receiving packets, user-interfaces, displaying information, etc.), which are typically communicatively coupled via one or more communications mechanisms 129 (e.g., bus, links, switching fabric, matrix), with the communications paths typically tailored to meet the needs of a particular application.

Various embodiments of apparatus 120 may include more or fewer elements. The operation of apparatus 120 is typically controlled by processor(s) 121 using memory 122 and storage device(s) 123 to perform one or more tasks or processes. Memory 122 is one type of computer-readable/computer-storage medium, and typically comprises random access memory (RAM), read only memory (ROM), flash memory, integrated circuits, and/or other memory components. Memory 122 typically stores computer-executable instructions to be executed by processor(s) 121 and/or data which is manipulated by processor(s) 121 for implementing functionality in accordance with an embodiment. Storage device(s) 123 are another type of computer-readable medium, and typically comprise solid state storage media, disk drives, diskettes, networked services, tape drives, and other storage devices. Storage device(s) 123 typically store computer-executable instructions to be executed by processor(s) 121 and/or data which is manipulated by processor(s) 121 for implementing functionality in accordance with an embodiment.

In one embodiment, the power consumed and heat generated by a content-addressable memory lookup operation is a function of the number of content-addressable memory entries searched. By partitioning these content-addressable memory entries into content-addressable memory blocks, only designated blocks are searched for a given search key. By programming related possible matching content-addressable memory entries into same particular blocks, only those particular blocks need to be searched thus reducing the power consumed and heat generated.

Further, when using a ternary content-addressable memory to perform longest prefix matching, some matching entries are longer than others. In one embodiment, it is advantageous to program a first set of content-addressable memory blocks with more fully expanded entries (e.g., longer, those with less bits being wildcards), and program the broader, less fully expanded entries (e.g., shorter, those with more bits being wildcards which will match more search keys) in a second set of content-addressable memory blocks. In one embodiment, the first set of content-addressable memory blocks is searched and if a matching result is located, the search is over. Otherwise, the second set of content-addressable memory blocks is searched. In one embodiment, this searching is sequential. In one embodiment, this searching is done in parallel.

In one embodiment, multiple lookup operations can be performed for different search keys in parallel as long as they are searching non-overlapping sets of content-addressable memory blocks (e.g., they have different search spaces). Thus, by splitting out the broader, less fully expanded entries into a second set of content-addressable memory blocks, two or more different non-overlapping first sets of content-addressable memory blocks can be simultaneously searched; and if needed, a subsequent search can be made of the second set of content-addressable memory blocks.

In further illustration, one embodiment programs a content-addressable memory block with the three Internet Protocol V4 entries of 10.0.1.1, 10.0.2.1, and 10.\*.\*.\*, with '\*' representing a wildcard matching any input value. For the two search keys of 10.0.1.1 and 10.0.2.1, simultaneous searches cannot be performed as they are searching the same set of content-addressable memory block(s). However, if one of two different first sets of content-addressable memory blocks is programmed with 10.0.1.1 and another one programmed 10.0.2.1, with a second set of content-addressable memory block(s) programmed with 10.\*.\*.\* (as this entry would match both search keys being discussed), then the searching of the first sets of content-addressable memory blocks can be done in parallel, as well as possibly reducing the number of content-addressable memory blocks actually searched. If no match is located in a first set of content-addressable memory block(s) for one of these lookup operations, then the second set of content-addressable memory block(s) is searched for the corresponding search key or keys.

Figure 2:
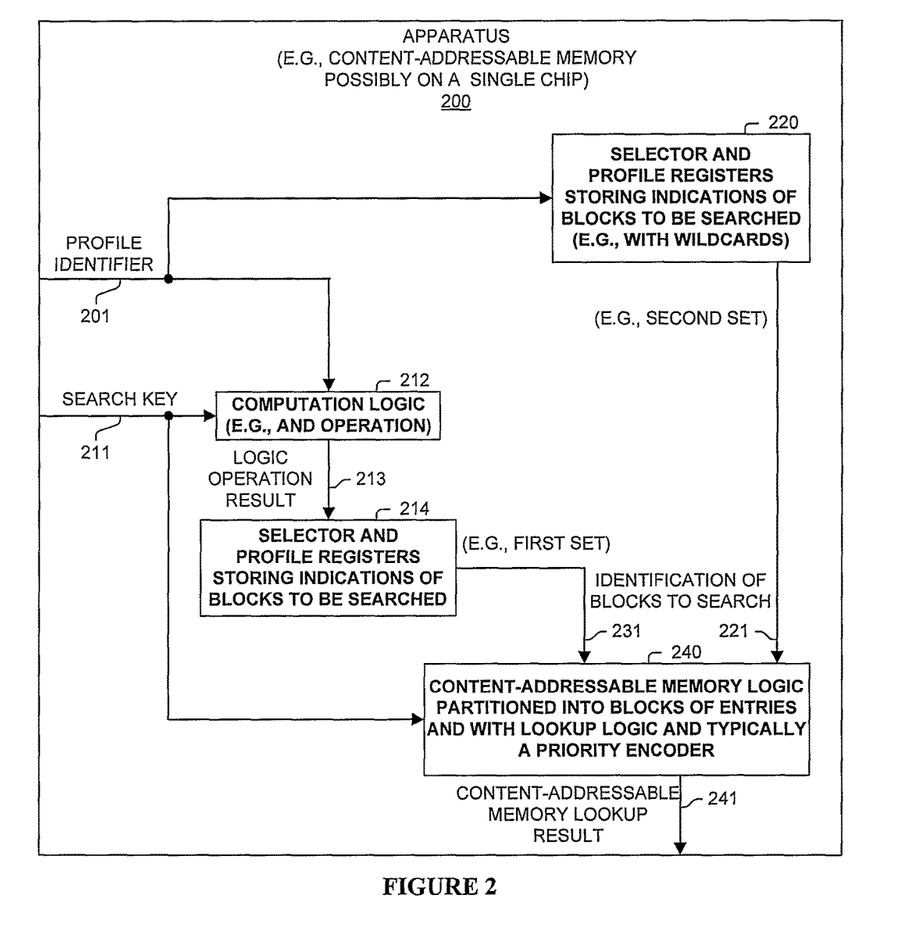
FIG. 2 illustrates an apparatus including a content-addressable memory according to one embodiment.

FIG. 2 illustrates an apparatus 200 operating according to one embodiment. As shown, apparatus 200 may include a content-addressable memory or be considered a content-addressable memory that performs additional functions according to one embodiment. In one embodiment, apparatus 200 or a portion thereof (e.g., 240) is implemented on a single chip.

As shown, apparatus 200 includes two different disciplines for identifying different (231, 221) sets of blocks within content-addressable memory logic 240 for searching. Input to apparatus 200 is profile identifier 201 used in identifying the sets of content-addressable memory block(s) to be searched, and search key 211 on which lookup operations are performed to find matching entries and possibly also used in identifying the sets to be searched.

In a first of these disciplines, a combination of profile identifier 201 and search key 211 is used to identify (231) the first set of content-addressable memory block(s) to be searched. A search is performed on this first set of content-addressable memory block(s) based on search key 211.

In one embodiment, bits of search key 211 and profile identifier 201 are bitwise AND'ed (212) with this logic operation result 213 used to select a register (e.g., memory or other storage location) from multiple registers storing corresponding indications of first sets of content-addressable memory block(s) (214), with the corresponding indication 231 provided to content-addressable memory logic 240. Content-addressable memory logic 240 performs the matching operations based on search key 211 in the identified (231) content-addressable memory block(s). In one embodiment, all matching entries are identified (241). In one embodiment, the highest-priority matching entry determined by a priority encoder or other mechanism is identified (241). In one embodiment, in response to no matches being identified, a no-match indication (241) is provided.

In a second of these disciplines, profile identifier 201 is used to identify (221) the second set of content-addressable memory block(s) to be searched. A search is performed on this second set of content-addressable memory block(s) based on search key 211. In one embodiment, profile identifier 201 is used to select a register (e.g., memory or other storage location) from multiple registers storing corresponding indications of second sets of content-addressable memory block(s) (220), with the corresponding selected indication 221 provided to content-addressable memory logic 240. Content-addressable memory logic 240 performs the matching operations based on search key 211 in the identified (221) content-addressable memory block(s). In one embodiment, all matching entries are identified (241). In one embodiment, the highest-priority matching entry determined by a priority encoder or other mechanism is identified (241). In one embodiment, in response to no matches being identified, a no-match indication (241) is provided.

In one embodiment, each of the first and second disciplines is performed for each search key 211 and profile identifier 201. In one embodiment for a search key 211 and profile identifier 201, the second discipline is only performed in response to the first discipline not finding a matching content-addressable memory entry.

Figure 3:
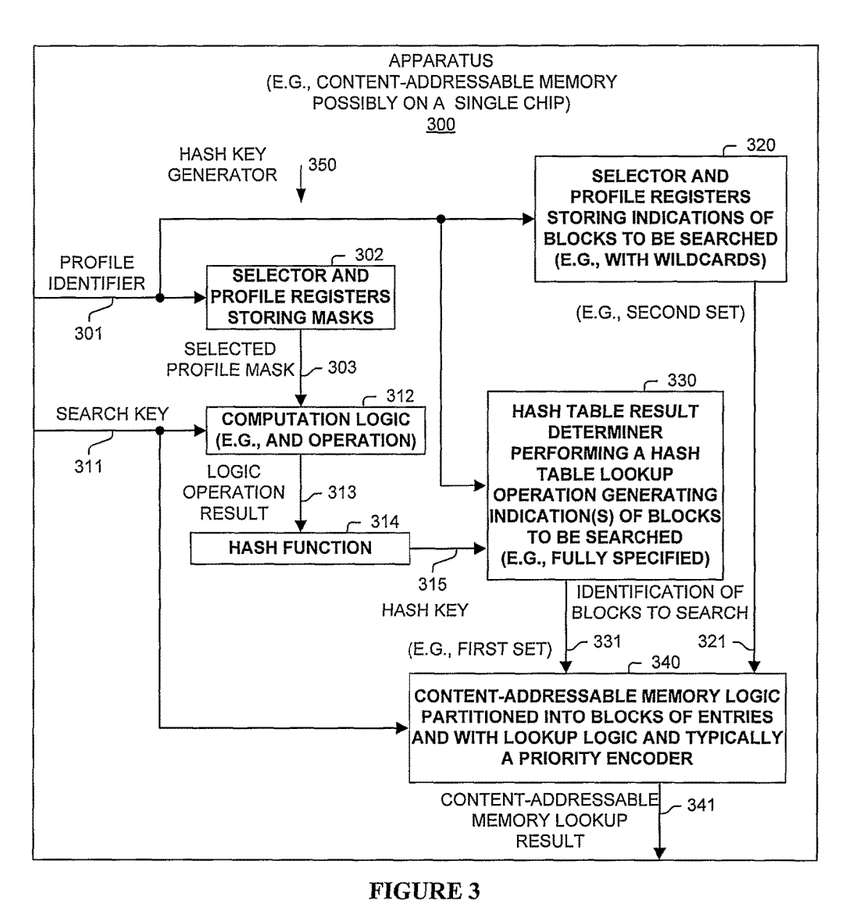
FIG. 3 illustrates an apparatus including a content-addressable memory according to one embodiment.

FIG. 3 illustrates an apparatus 300 operating according to one embodiment. As shown, apparatus 300 may include a content-addressable memory or be considered a content-addressable memory that performs additional functions according to one embodiment. In one embodiment, apparatus 300 or a portion thereof (e.g., 340) is implemented on a single chip.

As shown, apparatus 300 includes two different disciplines for identifying different (331, 321) sets of blocks within content-addressable memory logic 340 for searching. Input to apparatus 300 is profile identifier 301 used in identifying the sets of content-addressable memory block(s) to be searched, and search key 311 on which the lookup operations are performed to find matching entries and possibly also used in identifying the sets to be searched.

In a first of these disciplines, a combination of profile identifier 301 and search key 311 is used to identify (331) the first set of content-addressable memory block(s) to be searched. A search is performed on this first set of content-addressable memory block(s) based on search key 311.

One embodiment uses a hash key generator 350. Profile identifier 301 is used to select a register (e.g., memory or other storage location) from multiple registers storing masks and producing the selected profile mask 303. Bits of search key 311 and the selected profile mask 303 are bitwise AND'ed (312) with this logic operation result 313 provided to hash function 314 producing hash key 315.

A lookup operation is performed in hash table lookup unit with hash table 330 based on hash key 315 and typically profile identifier 301 (to narrow the search space). The result of this hash table lookup provides a corresponding indication 331 of first sets of content-addressable memory block(s) to content-addressable memory logic 340. Content-addressable memory logic 340 performs the matching operations based on search key 311 in the identified (331) content-addressable memory block(s). In one embodiment, all matching entries are identified (341). In one embodiment, the highest-priority matching entry determined by a priority encoder or other mechanism is identified (341). In one embodiment, in response to no matches being identified, a no-match indication (341) is provided.

In a second of these disciplines, profile identifier 301 is used to identify (321) the second set of content-addressable memory block(s) to be searched. A search is performed on this second set of content-addressable memory block(s) based on search key 311. In one embodiment, profile identifier 301 is used to select a register (e.g., memory or other storage location) from multiple registers storing corresponding indications of second sets of content-addressable memory block(s) (320), with the corresponding indication 321 provided to content-addressable memory logic 340. Content-addressable memory logic 340 performs the matching operations based on search key 311 in the identified (321) content-addressable memory block(s). In one embodiment, all matching entries are identified (341). In one embodiment, the highest-priority matching entry determined by a priority encoder or other mechanism is identified (341). In one embodiment, in response to no matches being identified, a no-match indication (341) is provided.

In one embodiment, each of the first and second disciplines is performed for each search key 311 and profile identifier 301. In one embodiment for a search key 311 and profile identifier 301, the second discipline is only performed in response to the first discipline not finding a matching content-addressable memory entry.

Figure 4:
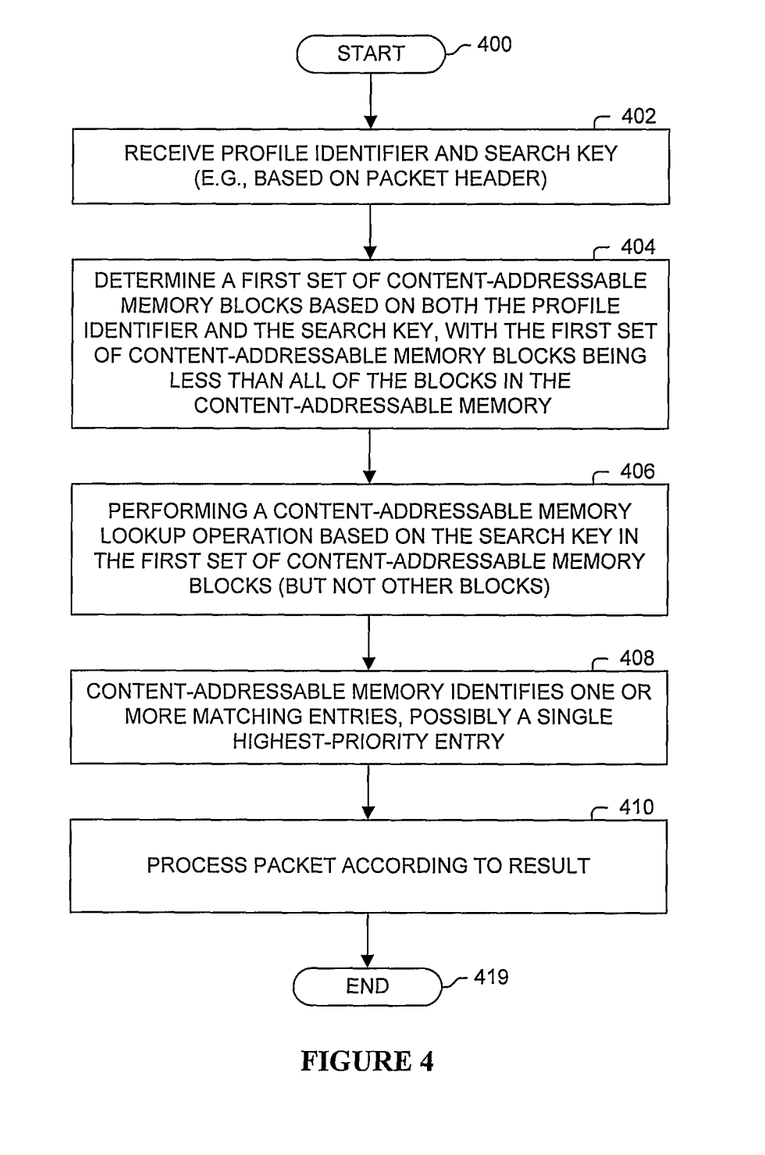
FIG. 4 illustrates a process according to one embodiment.

FIG. 4 illustrates a process performed in one embodiment. Processing begins with process block 400. In process block 402, the profile identifier and search key are received by the content-addressable memory apparatus, typically derived from one or more fields of a packet header. In process block 404, a first set of content-addressable memory blocks is determined based on both the profile identifier and the search key, with the first set of content-addressable memory blocks being less than all of the blocks in the content-addressable memory. In process block 406, a content-addressable memory lookup operation is performed based on the search key in the first set of content-addressable memory blocks (but not other blocks). In process block 408, the content-addressable memory apparatus identifies one or more matching entries, possibly a single highest-priority matching entry. In process block 410, the packet corresponding to the search key is processed (e.g., forwarded, dropped, or otherwise manipulated) according to the content-addressable memory lookup result (e.g., a matching or no-matching result). Processing of the flow diagram of FIG. 4 is complete as indicated by process block 419.

Figure 5:
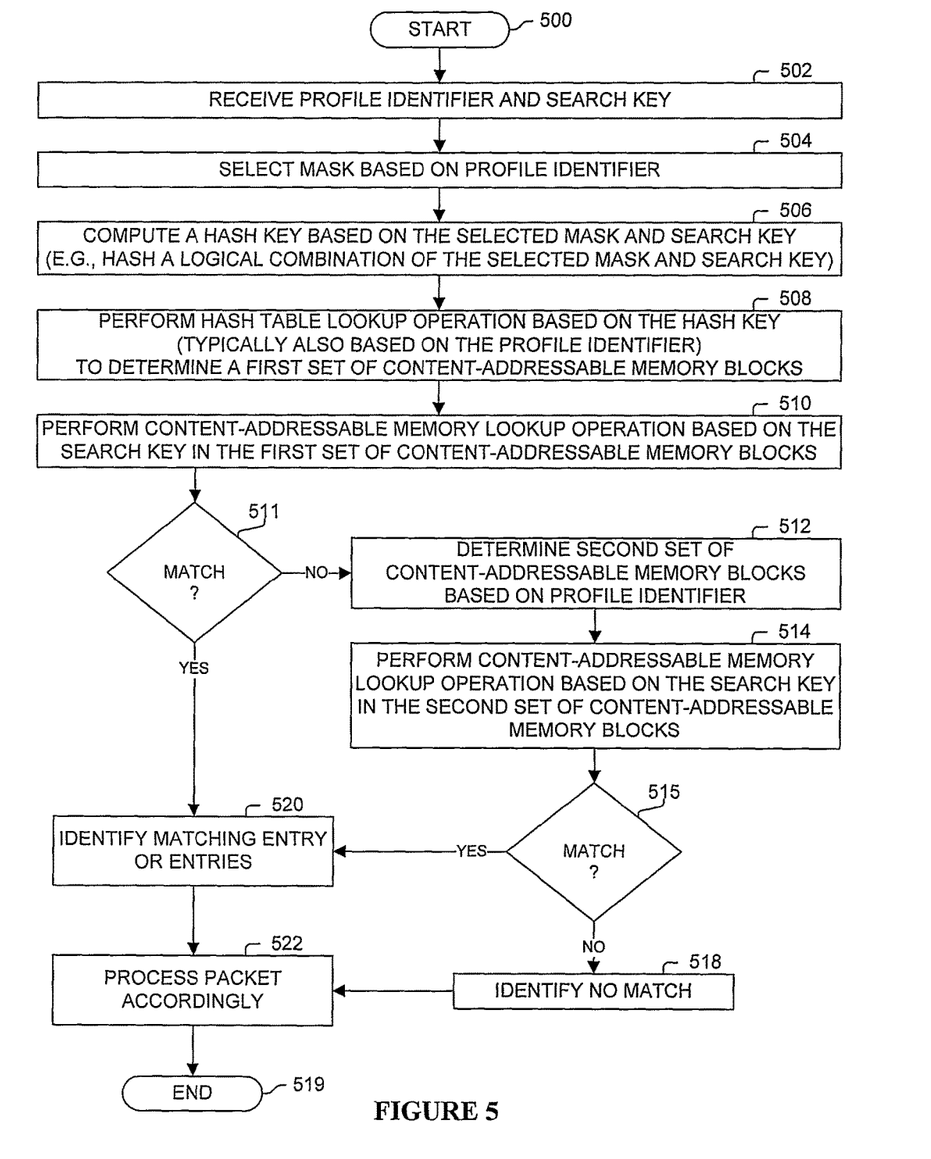
FIG. 5 illustrates a process according to one embodiment.

FIG. 5 illustrates a process performed in one embodiment. Processing begins with process block 500. In process block 502, the profile identifier and search key are received by the content-addressable memory apparatus. In process block 504, a mask (e.g., value) is selected based on the profile identifier. In process block 506, a hash key is computed based on the selected mask and search key (e.g., hash a logical combination of the selected mask and search key). In process block 508, a hash table lookup operation is performed based on the hash key (typically also based on the profile identifier to narrow the search space) to determine a first set of content-addressable memory blocks.

In process block 510, content-addressable memory lookup operation is performed based on the search key in the first set of content-addressable memory blocks. As determined in process block 511, if a matching entry is located in the selected content-addressable memory blocks, then processing proceeds to process block 520. Otherwise, processing proceeds to process block 512 to search the content-addressable memory via a second discipline.

In process block 512, the second set of content-addressable memory blocks is determined based on profile identifier. In process block 514, a content-addressable memory lookup operation is performed based on the search key in the second set of content-addressable memory blocks. As determined in process block 515, if a matching entry is located in the selected content-addressable memory blocks, then processing proceeds to process block 520. Otherwise, processing proceeds to process block 515. In process block 518, a no-match result is identified and processing proceeds to process block 522.

In process block 520, the content-addressable memory apparatus identifies one or more matching entries, possibly a single highest-priority entry; and processing proceeds to process block 522.

In process block 522, the packet corresponding to the search key is processed (e.g., forwarded, dropped, or otherwise manipulated) according to the content-addressable memory lookup result (e.g., a matching or no-matching result). Processing of the flow diagram of FIG. 5 is complete as indicated by process block 519.

In view of the many possible embodiments to which the principles of the disclosure may be applied, it will be appreciated that the embodiments and aspects thereof described herein with respect to the drawings/figures are only illustrative and should not be taken as limiting the scope of the disclosure. For example, and as would be apparent to one skilled in the art, many of the process block operations can be re-ordered to be performed before, after, or substantially concurrent with other operations. Also, many different forms of data structures could be used in various embodiments. The disclosure as described herein contemplates all such embodiments as may come within the scope of the following claims and equivalents thereof.

What is claimed is:

1. A method, comprising:
   determining a first one or more content-addressable memory blocks within a content-addressable memory based on a content-addressable memory profile identifier and a search key, with the first one or more content-addressable memory blocks being less than all of searchable content-addressable memory blocks within the content-addressable memory and not including a second one or more content-addressable memory blocks within the content-addressable memory, and with each of the first and second one or more content-addressable memory blocks including a plurality of content-addressable memory entries; and performing a first content-addressable memory lookup operation in each of the first one or more content-addressable memory blocks, but not in the second one or more content-addressable memory blocks, based on the search key resulting in the identification of one or more first content-addressable memory matching entries;

wherein said determining the first one or more content-addressable memory blocks includes:

creating a hash key based on the content-addressable memory profile identifier and the search key; and performing a hash table lookup operation in a hash table based on the hash key.

2. The method of claim 1, wherein said creating the hash key includes: determining a selected profile mask from a plurality of profile masks based on the content-addressable memory profile identifier, and computing the hash key based on the selected profile mask and the search key.

3. The method of claim 2, wherein said computing the hash key includes performing a binary AND operation between corresponding bits of the selected profile mask and the search key.

4. The method of claim 1, wherein the content-addressable memory is a ternary content-addressable memory (TCAM).

5. The method of claim 1, comprising selecting a highest-priority content-addressable memory lookup result from said one or more first content-addressable memory matching entries.

6. The method of claim 5, wherein said one or more first content-addressable memory matching entries includes a single longest prefix matching entry that matches the search key.

7. The method of claim 1, comprising:

determining the second one or more content-addressable memory blocks based on the content-addressable memory profile identifier but not based on the search key; and performing a second associative lookup operation in the second one or more content-addressable memory blocks resulting in the identification of one or more second content-addressable memory matching entries.

8. The method of claim 7, comprising selecting the longest one of said one or more second content-addressable matching entries as the longest prefix matching entry in the content-addressable memory matching the search key in a context defined by the content-addressable memory profile identifier.

9. The method of claim 8, wherein said creating the hash key includes: determining a selected profile mask from a plurality of profile masks based on the content-addressable memory profile identifier, and computing the hash key based on the selected profile mask and the search key.

10. A method, comprising:

determining a first one or more content-addressable memory blocks within a content-addressable memory based on a content-addressable memory profile identifier and a search key, with the first one or more content-addressable memory blocks being less than all of searchable content-addressable memory blocks within the content-addressable memory and not including a second one or more content-addressable memory blocks within the content-addressable memory, and with each of the first and second one or more content-addressable memory blocks including a plurality of content-addressable memory entries; and performing a first content-addressable memory lookup operation in each of the first one or more content-addressable memory blocks, but not in the second one or more content-addressable memory blocks, based on the search key resulting in the identification of no content-addressable memory matching entries;

determining the second one or more content-addressable memory blocks based on the content-addressable memory profile identifier but not based on the search key; and performing a second associative lookup operation in the second one or more content-addressable memory blocks resulting in the identification of one or more second content-addressable memory matching entries;

wherein said determining the first one or more content-addressable memory blocks includes:

creating a hash key based on the content-addressable memory profile identifier and the search key; and performing a hash table lookup operation in a hash table based on the hash key.

11. The method of claim 10, wherein said determining the second one or more content-addressable memory blocks and said performing the second associative lookup operation are performed in response to said performing the first content-addressable memory lookup operation resulting in the identification of no content-addressable memory matching entries.

12. The method of claim 10, comprising selecting the longest one of said one or more second content-addressable memory matching entries as the longest prefix matching entry in the content-addressable memory matching the search key in a context defined by the content-addressable memory profile identifier.

13. The method of claim 10, wherein said creating the hash key includes: determining a selected profile mask from a plurality of profile masks based on the content-addressable memory profile identifier, and computing the hash key which includes performing a binary AND operation between corresponding bits of the selected profile mask and the search key.

14. An apparatus, comprising:

a first selector generating one or more first indications of a first one or more content-addressable memory blocks within a content-addressable memory based on a content-addressable memory profile identifier and a search key, with the first one or more content-addressable memory blocks being less than all of searchable content-addressable memory blocks within the content-addressable memory and not including a second one or more content-addressable memory blocks within the content-addressable memory, and with each of the first and second one or more content-addressable memory blocks including a plurality of content-addressable memory entries; and a content-addressable memory lookup unit performing a first content-addressable memory lookup operation in each of the first one or more content-addressable memory blocks but not in the second one or more content-addressable memory blocks according to said one or more first indications based on the search key resulting in the identification of one or more first content-addressable memory matching entries;

wherein the first selector includes:
a profile determiner selecting a selected profile mask from a plurality of stored profile masks based on the content-addressable memory profile identifier;
a hash key generator creating a hash key based on the content-addressable memory profile identifier and the search key; and
a hash-table result determiner performing a hash table lookup operation based on the hash key in stored hash table entries resulting in a hash table lookup result corresponding to said one or more first indications.

15. The apparatus of claim 14, wherein said creating the hash key includes performing a binary AND operation between corresponding bits of the selected profile mask and the search key.

16. The apparatus of claim 14, wherein the content-addressable memory is a ternary content-addressable memory (TCAM).

17. The apparatus of claim 14, comprising a second selector generating one or more second indications of the second one or more content-addressable memory blocks based on the content-addressable memory profile identifier but not based on the search key; and
wherein the content-addressable memory lookup unit performs a second content-addressable memory lookup operation in each of the second one or more content-addressable memory blocks but not in the first one or more content-addressable memory blocks according to said second one or more indications based on the search key resulting in the identification of one or more second content-addressable memory matching entries.

* * * * *